(12) United States Patent
Nakazawa et al.

(10) Patent No.: US 8,526,066 B2
(45) Date of Patent: Sep. 3, 2013

(54) ANALOG PROCESSING CIRCUIT, ANALOG INTEGRATED CIRCUIT DEVICE, IMAGE READING DEVICE, AND IMAGE FORMING APPARATUS

(75) Inventors: Masamoto Nakazawa, Kanagawa (JP); Tohru Kanno, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 1197 days.

(21) Appl. No.: 12/099,508

(22) Filed: Apr. 8, 2008

(65) Prior Publication Data

US 2008/0252787 A1    Oct. 16, 2008

(30) Foreign Application Priority Data

Apr. 16, 2007    (JP) .................................. 2007-107133

(51) Int. Cl.
    *H04N 1/40* (2006.01)
(52) U.S. Cl.
    USPC ............................ 358/445; 358/446; 358/448
(58) Field of Classification Search
    None
    See application file for complete search history.

(56) References Cited

U.S. PATENT DOCUMENTS

| | | | |
|---|---|---|---|
| 5,402,249 A * | 3/1995 | Koseki et al. ................. | 358/446 |
| 5,408,113 A | 4/1995 | Kanno et al. | |
| 6,198,349 B1 | 3/2001 | Kanno et al. | |
| 6,426,804 B1 | 7/2002 | Kanno et al. | |
| 2004/0047007 A1 | 3/2004 | Kanno | |
| 2006/0077601 A1* | 4/2006 | Ikeda et al. ...................... | 361/56 |
| 2007/0188638 A1 | 8/2007 | Nakazawa et al. | |
| 2008/0024842 A1 | 1/2008 | Tsukahara et al. | |
| 2008/0068467 A1 | 3/2008 | Kanno et al. | |
| 2008/0068683 A1 | 3/2008 | Kanno | |

FOREIGN PATENT DOCUMENTS

| | | |
|---|---|---|
| JP | 5-316338 A | 11/1993 |
| JP | 9-106590 | 4/1997 |
| JP | 3649569 | 2/2005 |
| JP | 2007-19764 A | 1/2007 |

OTHER PUBLICATIONS

U.S. Appl. No. 11/723,426, filed Aug. 16, 2007, Unknown.

* cited by examiner

*Primary Examiner* — Thierry L Pham

(74) *Attorney, Agent, or Firm* — Oblon, Spivak, McClelland, Maier & Neustadt, L.L.P.

(57) ABSTRACT

A first clamping unit clamps a base voltage of an input image signal to a predetermined reference voltage. A sampling-and-holding unit samples and holds the image signal after clamping or a reference signal that becomes the base voltage of the image signal. An amplifying unit amplifies the image signal sampled and held by the sampling-and-holding unit. An analog-to-digital converting unit converts the image signal after amplification into a digital image signal. A second clamping unit clamps the reference signal to a predetermined voltage.

6 Claims, 12 Drawing Sheets

ANALOG PROCESSING CIRCUIT, ANALOG INTEGRATED CIRCUIT DEVICE, IMAGE READING DEVICE, AND IMAGE FORMING APPARATUS

CROSS-REFERENCE TO RELATED APPLICATIONS

The present application claims priority to and incorporates by reference the entire contents of Japanese priority document 2007-107133 filed in Japan on Apr. 16, 2007.

BACKGROUND OF THE INVENTION

1. Field of the Invention

The present invention relates to an analog processing circuit, an analog integrated circuit device, an image reading device, and an image forming apparatus.

2. Description of the Related Art

Generally, in an image reading device (e.g., a scanner) mounted on an image forming apparatus (e.g., a copying machine), a sheet having an image thereon is irradiated with a light and the light reflected from the sheet is converted into an analog image signal through a charged-coupled device (CCD) line image sensor such that the image on the sheet is read. Consequently, the analog image signal is subjected to a number of analog processes in an analog front end (AFE) that is an analog integrated circuit device. The AFE finally converts the analog image signal into digital data and outputs the digital data.

The analog processes performed on the analog image signal include voltage clamping, sampling and holding, signal amplification, offset correction, and analog-to-digital conversion. First, a base voltage of the analog image signal is clamped to a reference voltage within the supply range of the AFE (i.e., voltage clamping). Then, a differential measurement is performed between a clamped voltage and the reference voltage to obtain an image signal component of the analog image signal. The image signal component is then subjected to sampling and holding.

However, there is a possibility that the reference voltage fluctuates due to the charge fluctuation (ripples) in a CCD driving signal that is used for driving the CCD line image sensor. Consequently, irrespective of whether the analog image signal supplied for performing the differential measurement is maintained at a constant level, the result keeps varying because of the fluctuation in the reference voltage. Moreover, scanning lines of the CCD line image sensor also vary in synchronization with the charge fluctuation. That results in vertical lines or waves in the image thereby degrading the image quality.

The cause of such a problem is that the clamped voltage and the reference voltage are essentially different types of voltages. More particularly, the clamped voltage of the analog image signal is obtained by clamping the base voltage of the analog image signal to the reference voltage by using the electric potential charged in a capacitor. As a result, even if there is fluctuation in the reference voltage, the clamped voltage remains, in principle, free of ripples. Meanwhile, the reference voltage uses a signal having ripples as it is. Thus, a difference in the clamped voltage and the reference voltage obtained from the differential measurement is not able to eliminate the effect of the inherent fluctuation.

Japanese Patent Application Laid-open No. H9-106590 and Japanese Patent No. 3649569 disclose a technique in which the charge fluctuation is restricted by increasing the decoupling amount of the reference voltage.

However, in the case of a high density image, even a slight fluctuation of few milivolts in the reference voltage results in image deformation. Thus, there are practical limitations in restricting the fluctuation only by adjusting the decoupling amount. Moreover, depending on a gain during signal amplification, the image deformation becomes more prominent.

SUMMARY OF THE INVENTION

It is an object of the present invention to at least partially solve the problems in the conventional technology.

According to an aspect of the present invention, there is provided an analog processing circuit including a first clamping unit that clamps a base voltage of an input image signal to a predetermined reference voltage; a sampling-and-holding unit that samples and holds the image signal after clamping or a reference signal that becomes the base voltage of the image signal; an amplifying unit that amplifies the image signal sampled and held by the sampling-and-holding unit; an analog-to-digital converting unit that converts the image signal after amplification into a digital image signal; and a second clamping unit that clamps the reference signal to a predetermined voltage.

Furthermore, according to another aspect of the present invention, there is provided an analog integrated circuit device including an analog processing circuit that includes a first clamping unit that clamps a base voltage of an input image signal to a predetermined reference voltage, a sampling-and-holding unit that samples and holds the image signal after clamping or a reference signal that becomes the base voltage of the image signal, an amplifying unit that amplifies the image signal sampled and held by the sampling-and-holding unit, an analog-to-digital converting unit that converts the image signal after amplification into a digital image signal, and a second clamping unit that clamps the reference signal to a predetermined voltage.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings. The present invention is not limited to these exemplary embodiments.

Figure 1:
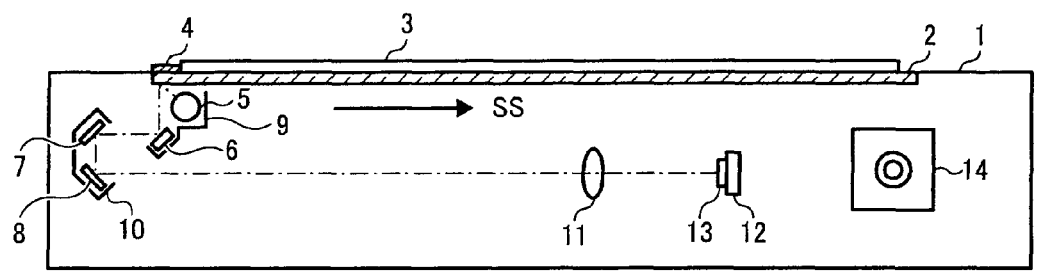
FIG. 1 is a schematic diagram of an image reading device according to a first embodiment of the present invention.

FIG. 1 is a schematic diagram of an image reading device according to a first embodiment of the present invention.

As shown in FIG. 1, a contact glass 2 is arranged on the upper surface of a housing 1 of the image reading device. An original document 3 having an image thereon is mounted between the contact glass 2 and a pressure plate (not shown). The pressure plate is arranged such that a target surface for reading of the original document 3 is maintained in close contact with the contact glass 2. A white standard board 4 is arranged at the left end of the contact glass 2, from where the image reading device starts reading the image on the original document 3. The white standard board 4 is used to obtain a white shading correction image.

After the target surface of the original document 3 is irradiated with a light from a light source 5, the light reflected from the target surface then sequentially reflects from a first mirror 6, a second mirror 7, and a third mirror 8, and eventually falls on a lens 11. The lens 11 then focuses the reflected light on a charged-coupled device (CCD) line image sensor 13 arranged on an image-reading control plate 12.

The light source 5 and the first mirror 6 are mounted on a first carriage 9 that moves back and forth in a sub-scanning direction SS. Similarly, the second mirror 7 and the third mirror 8 are mounted on a second carriage 10 that also moves back and forth in the sub-scanning direction SS. The second carriage 10 moves at half the speed of the first carriage 9 such that the optical path length between the contact glass 2 and the CCD line image sensor 13 is maintained constant.

A scanner motor 14 moves the first carriage 9 and the second carriage 10.

Figure 2:
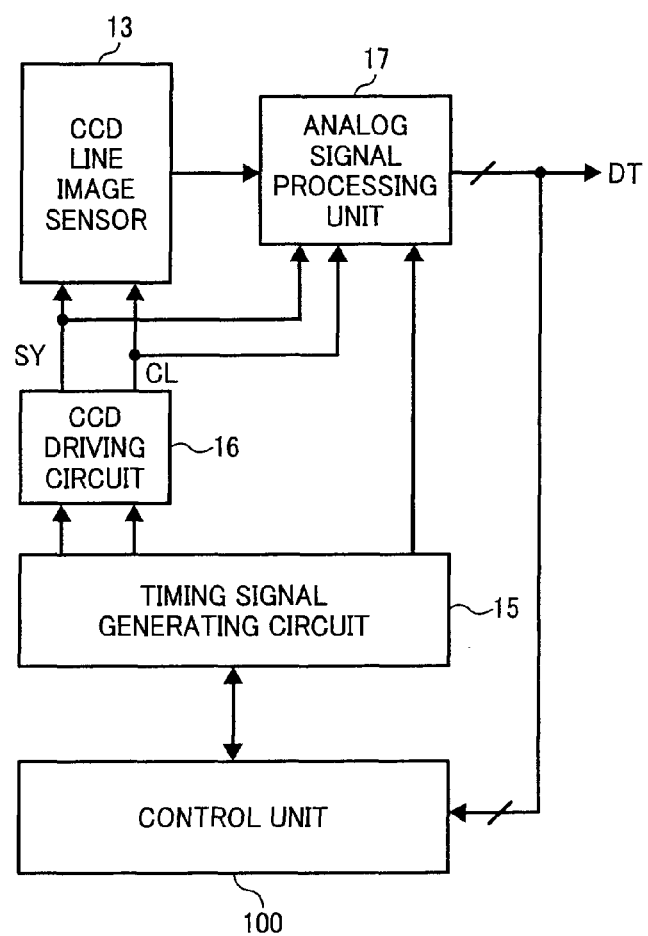
FIG. 2 is a schematic diagram of an exemplary image-reading control mechanism.

FIG. 2 is a schematic diagram of an exemplary image-reading control mechanism in the image reading device. The image-reading control mechanism is configured on the image-reading control plate 12 and includes the CCD line image sensor 13, a timing signal generating circuit 15, a CCD driving circuit 16, an analog signal processing unit 17, and a control unit 100.

The timing signal generating circuit 15 outputs various timing signals to the CCD driving circuit 16 and the analog signal processing unit 17. The CCD driving circuit 16 drives the CCD line image sensor 13, and transmits a synchronizing signal SY and a clocking signal CL to the CCD line image sensor 13 and the analog signal processing unit 17. The CCD line image sensor 13 generates an analog image signal for each scanning line and outputs the analog image signal to the analog signal processing unit 17.

The analog signal processing unit 17 is an analog integrated circuit device that performs voltage clamping, sampling and holding (S/H), black-level offset correction, signal amplification, and analog-to-digital (A/D) conversion on each analog image signal to obtain a digital image signal DT, and outputs each digital image signal DT to an upper-level circuit and the control unit 100.

During the black-level offset correction, the black level in an image within an arbitrary period is detected and subjected to feedback correction such that the black level is adjusted to a specified black-level target value.

The detection of the black level is sometimes performed in a blank pixel area. Because a blank pixel area does not exist physically, it can be secured for a longer period with respect to an optical-black (OPB) area.

The control unit 100 controls the CCD line image sensor 13 by controlling the timing signal generating circuit 15. The control unit 100 also controls the other constituent elements of the image reading device.

Figure 3:
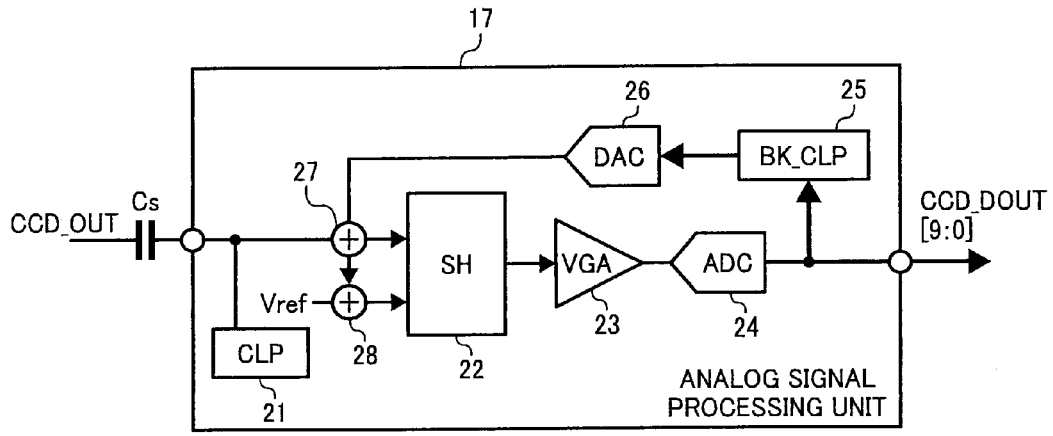
FIG. 3 is a schematic diagram of an example of an analog signal processing unit in the exemplary image-reading control mechanism.

FIG. 3 is a schematic diagram of an example of the analog signal processing unit 17.

As shown in FIG. 3, the analog signal processing unit 17 receives an analog image signal CCD_OUT, which is output by the CCD line image sensor 13, via a capacitor Cs.

The analog signal processing unit 17 includes a clamping circuit 21, a sampling/holding circuit 22, a variable gain amplifier (VGA) 23, an analog-to-digital converting (ADC) unit 24, a black offset correcting unit 25, and a digital-to-analog converting (DAC) unit 26. The clamping circuit 21 clamps a base voltage of the analog image signal CCD_OUT to an arbitrary voltage to obtain a clamped analog image signal. The sampling/holding circuit 22 performs a differential measurement between the clamped analog image signal and a reference signal Vref, which is generated internally in the analog signal processing unit 17, to obtain an image signal component of the clamped analog image signal, and samples and holds the image signal component. The VGA 23 amplifies an output signal from the sampling/holding circuit 22 if needed. The ADC unit 24 converts an amplified image signal component into a digital signal and outputs the digital signal. The black offset correcting unit 25 adjusts an input offset for the sampling/holding circuit 22 by using the DAC unit 26 such that the black level is maintained at a predetermined level.

A plus sign 27 indicates that the analog image signal CCD_OUT is corrected by a correction value of the black offset correcting unit 25 and then input to the sampling/holding circuit 22. Similarly, a plus sign 28 indicates that the reference signal Vref is corrected by a correction value of the black offset correcting unit 25 and then input to the sampling/holding circuit 22.

Figure 4:
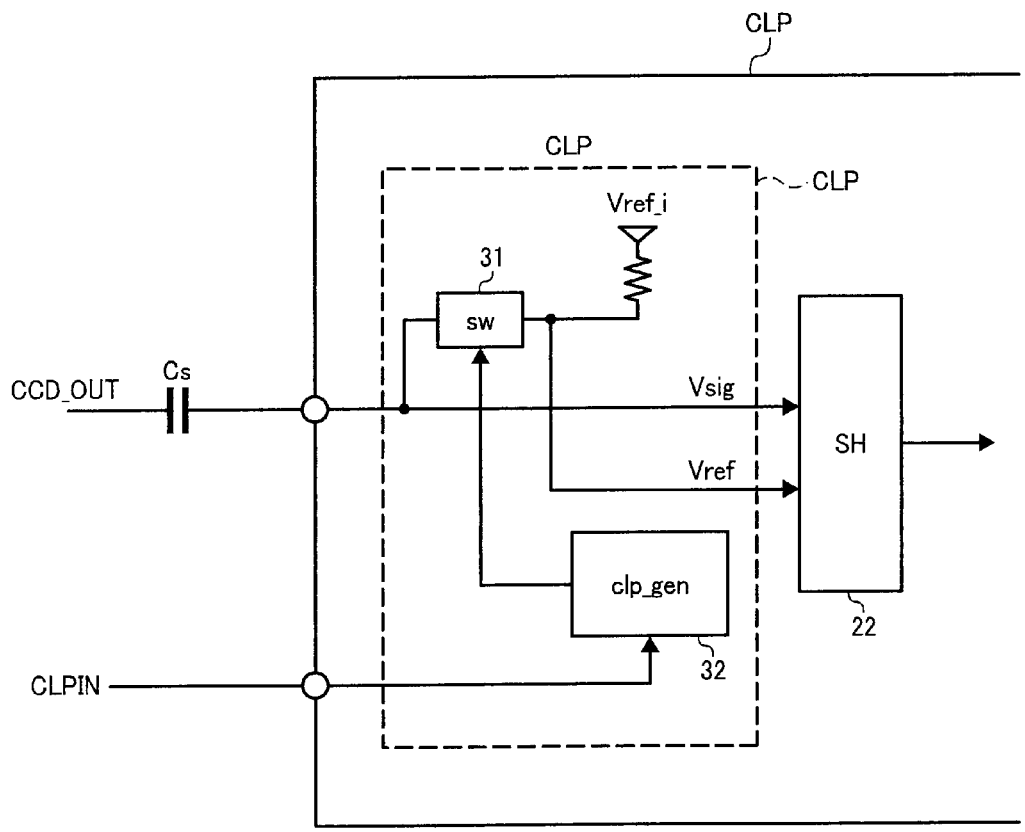
FIG. 4 is a schematic diagram of a first example of a clamping circuit in the analog signal processing unit.

FIG. 4 is a schematic diagram of a first example of the clamping circuit 21. The clamping circuit 21 includes a switching circuit 31 and a clamping signal generating unit 32.

During the process of voltage clamping, the base voltage of an image signal is adjusted to an internal reference voltage Vref_i.

An input line for the image signal is connected to the internal reference voltage Vref_i via the switching circuit 31. Regarding the reference signal Vref, the internal reference voltage Vref_i is used as it is.

The clamping signal generating unit 32 generates a control signal based on a clamping control signal CLPIN that input externally. The clamping signal generating unit 32 transmits the control signal to the switching circuit 31 and controls switching ON and switching off of the switching circuit 31.

Figure 5A:
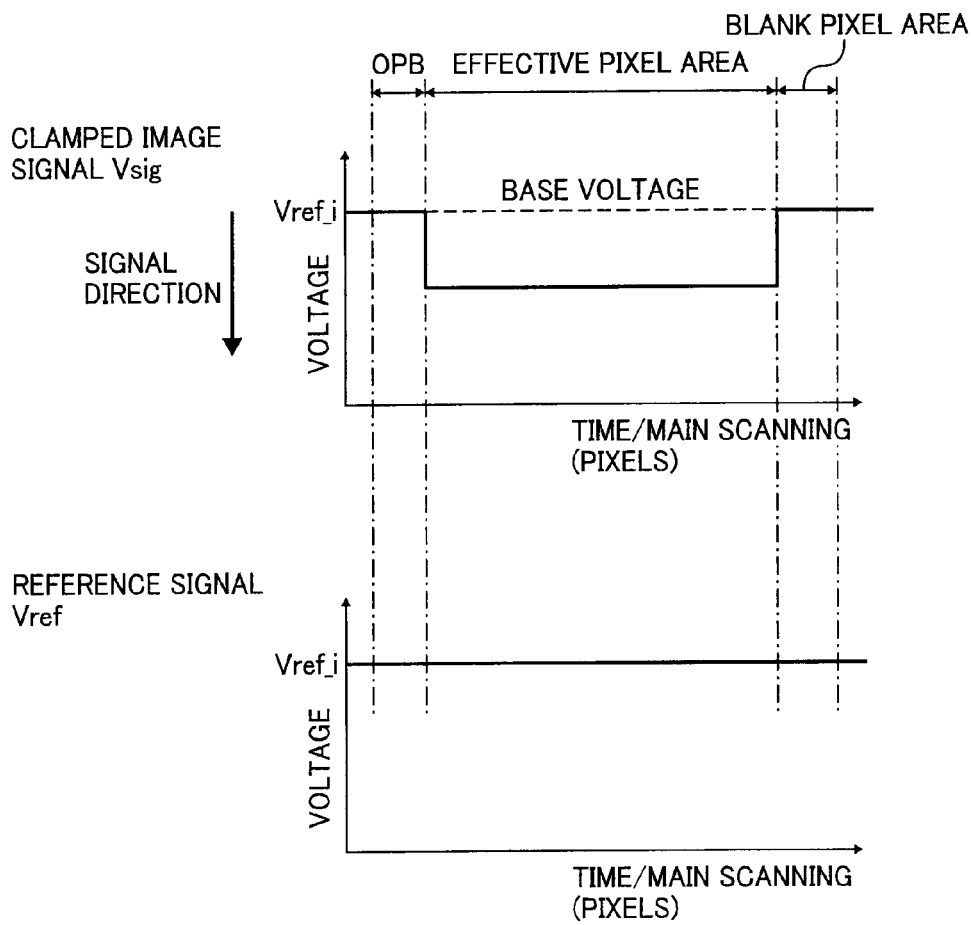
FIGS. 5A and 5B are signal waveform diagrams for explaining the operation of the clamping circuit.
Figure 5B:
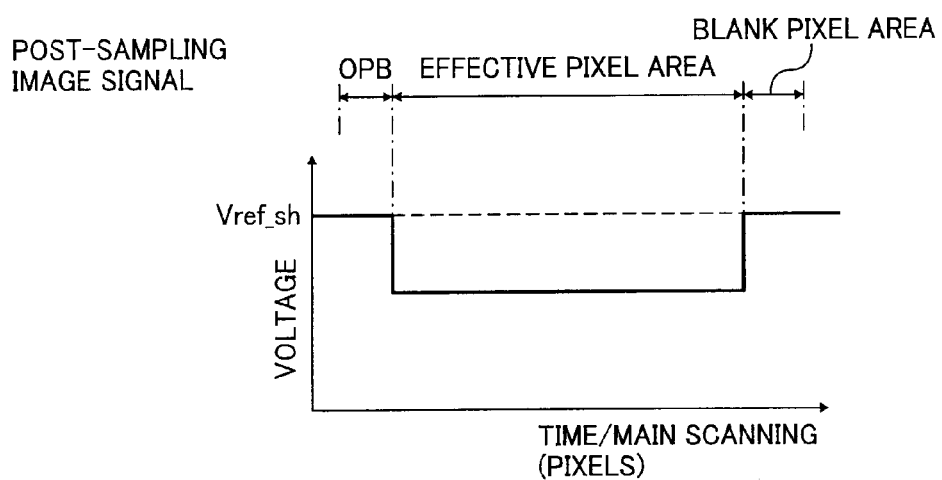

An image signal Vsig, whose base voltage is clamped to the reference signal Vref, is output to the sampling/holding circuit 22 along with the reference signal Vref. The sampling/holding circuit 22 performs a differential measurement between the image signal Vsig and the reference signal Vref to obtain an image signal component of a post-sampling base voltage Vref_sh, which is not necessarily equal to the reference signal Vref (see FIGS. 5A and 5B). The differential measurement between the image signal Vsig and the reference signal Vref is sometimes subjected to sampling and holding.

Figure 6A:
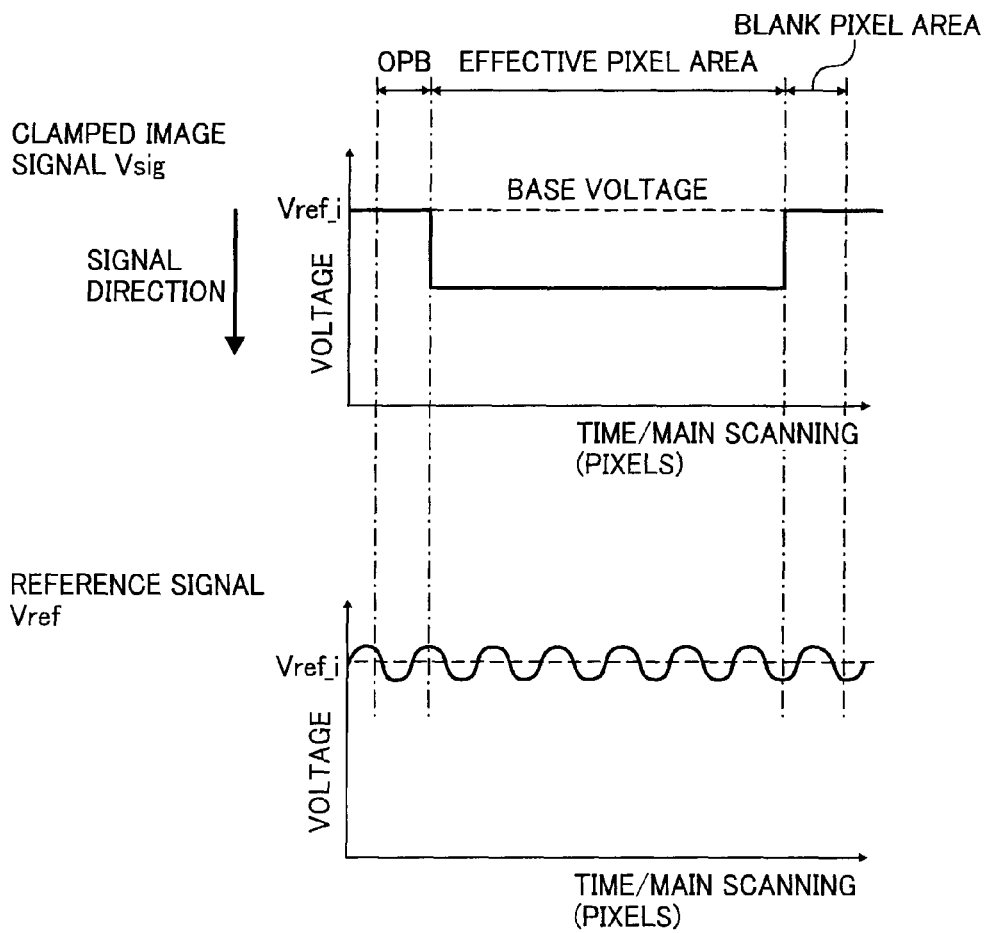
FIGS. 6A and 6B are signal waveform diagrams for explaining a problem in the operation of the clamping circuit.
Figure 6B:
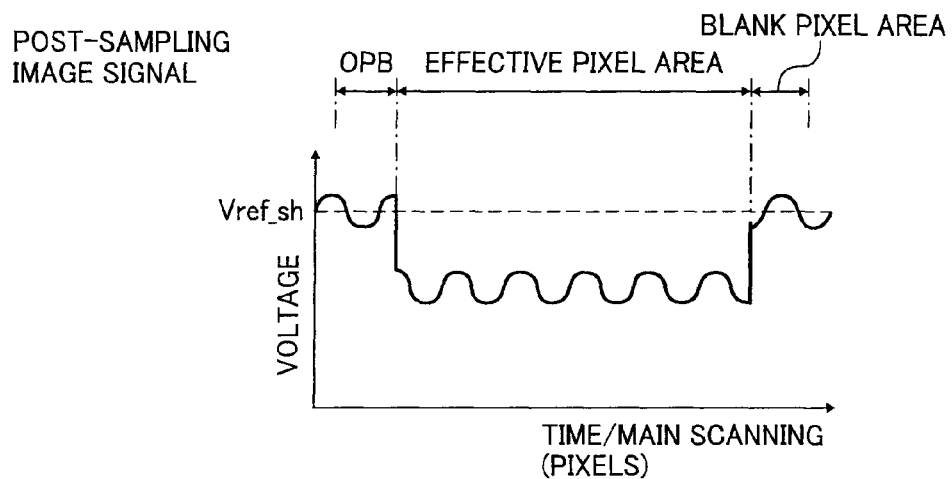

As shown in FIG. 4, the reference signal Vref is an internally generated voltage in the analog signal processing unit 17. The reference signal Vref is usually generated by a power supply. Thus, if there is power fluctuation in the power supply due to charge fluctuation, the reference signal Vref also fluctuates accordingly. Such fluctuation in the reference signal Vref affects the post-sampling base voltage Vref_sh obtained after the differential measurement (see FIGS. 6A and 6B). In particular, because the charge fluctuation occurs in synchronization with the main scanning line of the CCD line image sensor 13, vertical lines or waves appear in the image thereby degrading the image quality.

Such a problem occurs because only the reference signal Vref gets directly affected by the charge fluctuation, while the base voltage of the image signal remains unaffected. This happens due to the fact that an average voltage of the image signal within an assert period of the clamping control signal CLPIN is clamped to an average voltage of the reference signal Vref within the same assert period, and the post-clamping voltage of the image signal is determined based only on the electric potential charged in the capacitor Cs.

Figure 7:
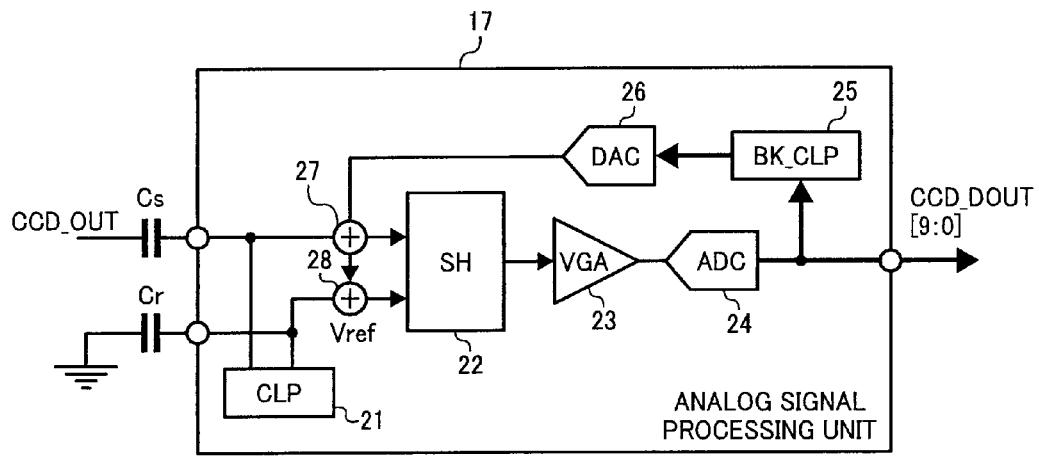
FIG. 7 is a schematic diagram of another example of the analog signal processing unit.
Figure 8:
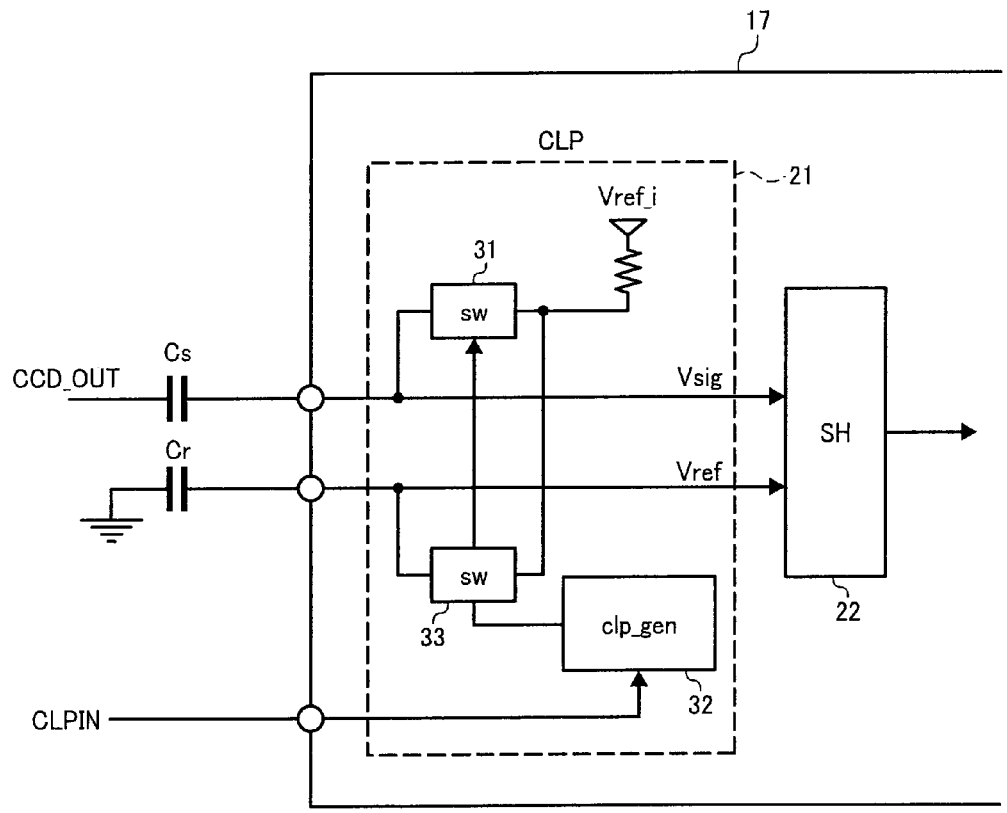
FIG. 8 is a schematic diagram of a second example of the clamping circuit.
Figure 9A:
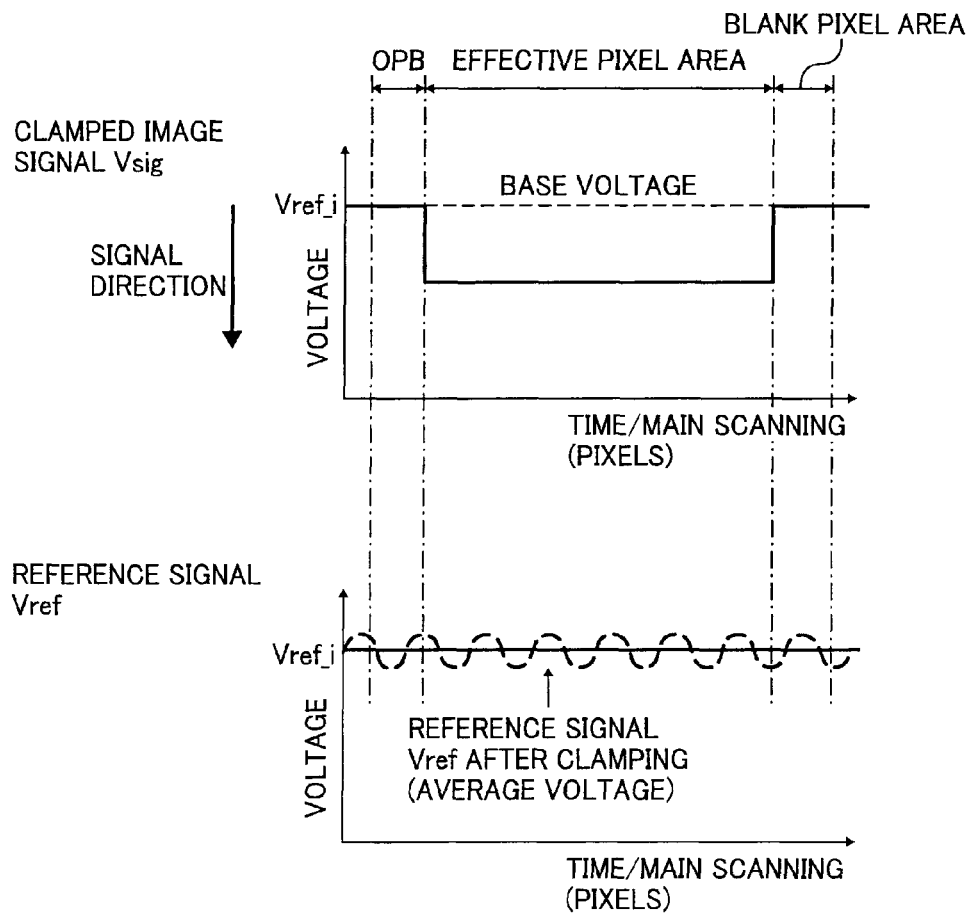
FIGS. 9A and 9B are signal waveform diagrams for explaining the operation of the clamping circuit shown in FIG. 8.
Figure 9B:
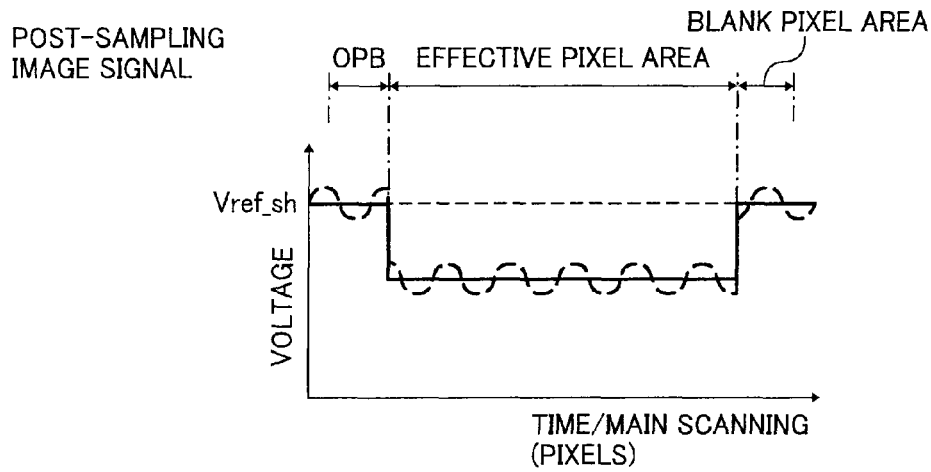

To solve such a problem, alike in the case of the image signal, voltage clamping is performed for the reference signal Vref such that the charge fluctuation does not have any effect in principle (see FIGS. 7 and 8). FIG. 7 is a schematic diagram of another example of the analog signal processing unit 17. FIG. 8 is a schematic diagram of a second example of the clamping circuit 21. Meanwhile, constituent elements in FIG. 7 having identical configuration to those in FIG. 3 are referred to by the same reference numerals and there description is not repeated. Similarly, constituent elements in FIG. 8 having identical configuration to those in FIG. 4 are referred to by the same reference numerals and there description is not repeated.

As shown in FIG. 7, a capacitor Cr is arranged to hold the reference voltage Vref. The clamping circuit 21 accumulates a base voltage Vre_i in the capacitor Cr.

As shown in FIG. 8, the sampling/holding circuit 22 is connected to a Vref-signal input terminal for the sampling/holding circuit 22. Inside the clamping circuit 21, the Vref-signal input terminal is connected to the internal reference voltage Vref_i via a switching circuit 33.

The control signal generated by the clamping signal generating unit 32 is transmitted to the switching circuit 31 as well as the switching circuit 33 such that the switching circuit 31 and the switching circuit 33 switch ON and switch off synchronously.

Thus, by clamping the reference signal Vref to a clamping voltage accumulated in the capacitor Cr, it is possible to maintain the reference signal Vref unaffected from the fluctuation in the internal reference voltage Vref_i. As a result, vertical lines or waves in the image can be prevented thereby maintaining the image quality. Although a ripple offset may occur between the standard level of the image signal and the reference signal Vref due to the fluctuation, it can be corrected by the black offset correcting unit 25.

Meanwhile, as compared to a conventional configuration, more capacitive loads are connected to the internal reference voltage Vref_i. As a result, the amount of time required for voltage clamping increases, which leads to increase in the start-up time after switching the power ON.

This problem happens due to the fact that the current capacity of the internal reference voltage Vref_i is restricted because of an ON-resistance of the switching circuit 31 and the switching circuit 33, or because of a resistance division at the time of generating the internal reference voltage Vref_i. Usually, the internal reference voltage Vref_i is generated by dividing the power supply voltage by a resistance of about several kilo ohms.

Figure 10:
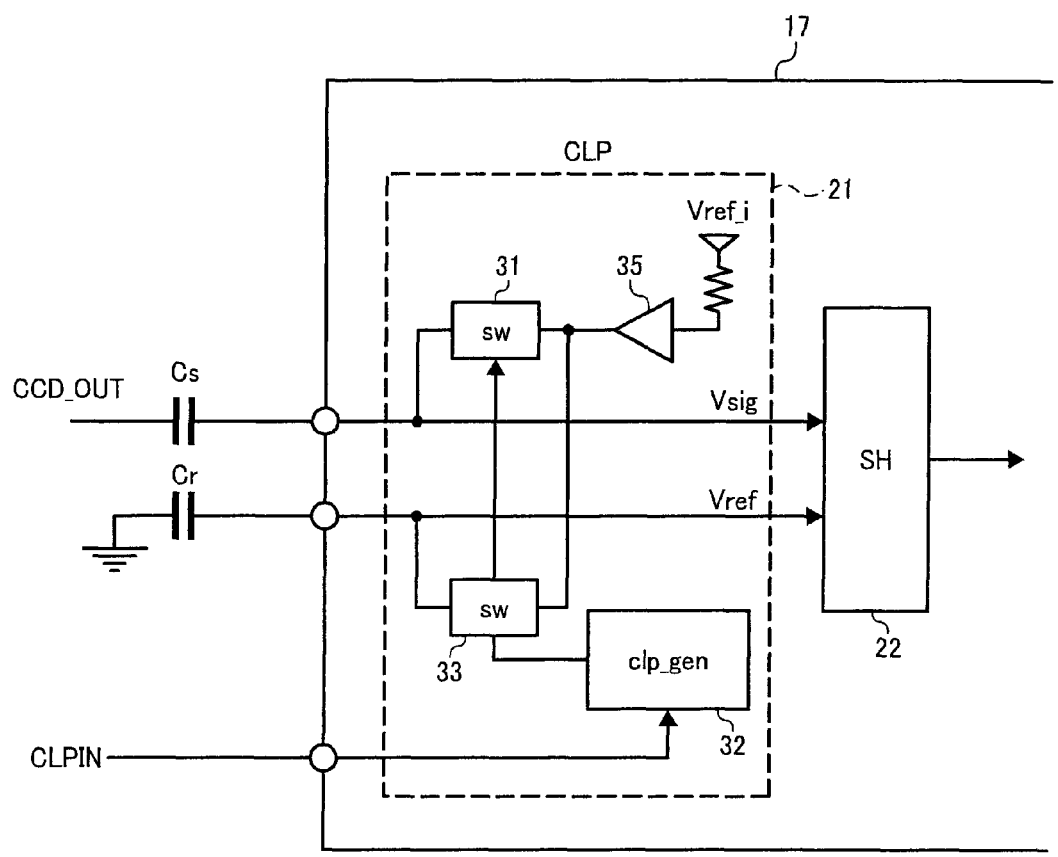
FIG. 10 is a schematic diagram of a third example of the clamping circuit.

To solve such a problem, the internal reference voltage Vref_i is transmitted to the switching circuit 31 and the switching circuit 33 via a buffer circuit 35 (see FIG. 10) such that the current capacity increases and the start-up time is reduced.

Although the buffer circuit 35 is combinedly used for the image signal Vsig and the reference signal Vref, it is also possible to arrange a separate buffer for each of the image signal Vsig and the reference signal Vref. To achieve a compact structure, however, usually it is better to arrange a single buffer of high buffering capacity rather than arranging a plurality of buffers of low buffering capacity. Meanwhile, integration of circuits as described above (e.g., arranging the clamping circuit 21 inside the analog signal processing unit 17) enables in downsizing the image reading device as well as reducing the manufacturing cost.

As described above, the internal reference voltage Vref_i is used for voltage clamping. However, a fixed value of the internal reference voltage Vref_i may prove to be inadequate if the analog image signal CCD_OUT has higher signal amplitude (dynamic range).

Figure 11:
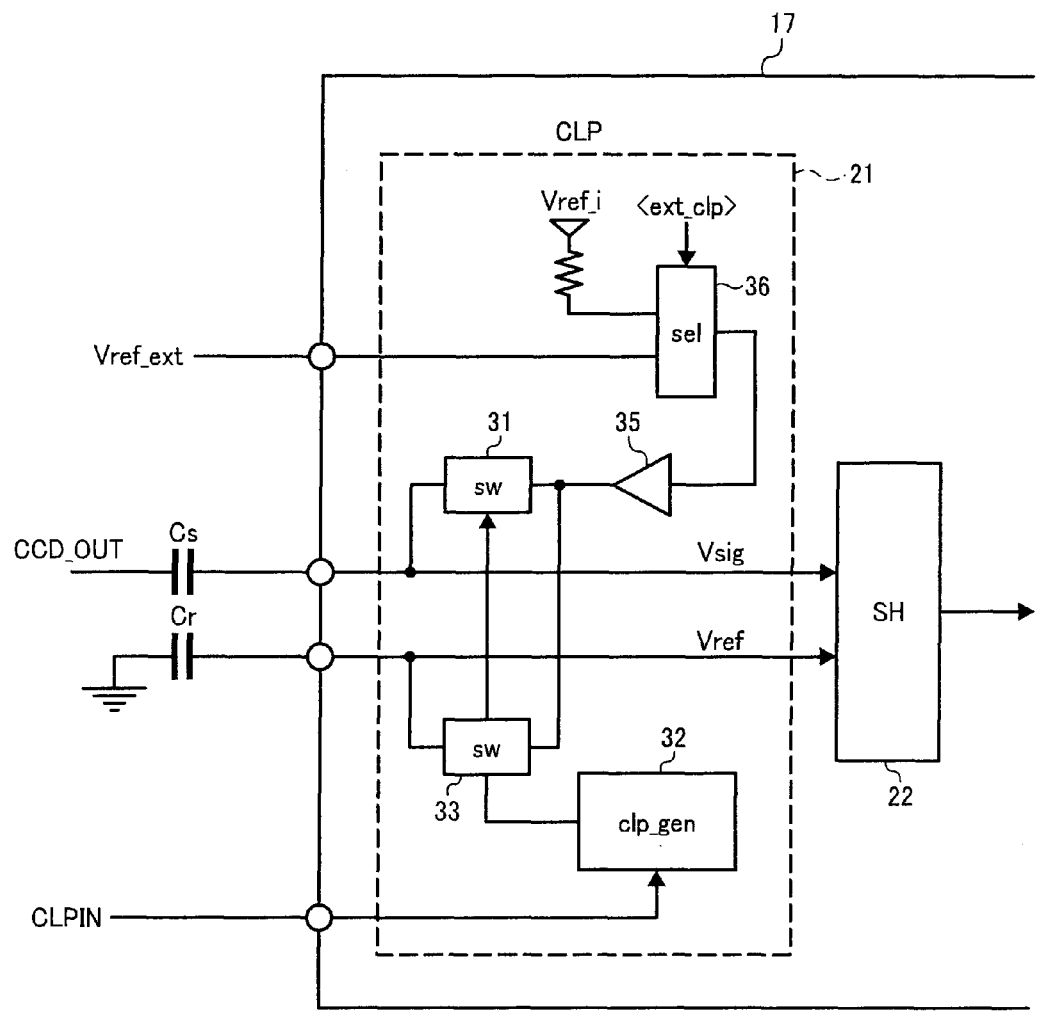
FIG. 11 is a schematic diagram of a fourth example of the clamping circuit.

Hence, the analog signal processing unit 17 as shown in FIG. 11 is configured such that, in addition to the internal reference voltage Vref_i generated internally, it is possible to externally input an external reference voltage Vref_ext depending on the signal amplitude of the analog image signal CCD_OUT.

Moreover, a selecting switch 36 is arranged in the analog signal processing unit 17 such that either one of the internal reference voltage Vref_i and the external reference voltage Vref_ext can be selected and transmitted to the switching circuit 31 as well as the switching circuit 33 via the buffer circuit 35. The selecting switch 36 selects between the internal reference voltage Vref_i and the external reference voltage Vref_ext by using an output signal ext_clp of a register (not shown). Instead of the selecting switch 36, a logical value of an external terminal for the external reference voltage Vref_ext can also be used.

Meanwhile, the capacitor Cr can also be arranged inside the analog signal processing unit 17. However, by arranging the capacitor Cr outside the analog signal processing unit 17, the storage capacity thereof can be changed as needed and the analog signal processing unit 17 can also be downsized.

Considering a case when the reference signal Vref is input externally, it is necessary to arrange an external terminal for Vref-signal output. Meanwhile, constituent elements in FIG. 12 having identical configuration to those in FIG. 11 are referred to by the same reference numerals and there description is not repeated.

Figure 12:
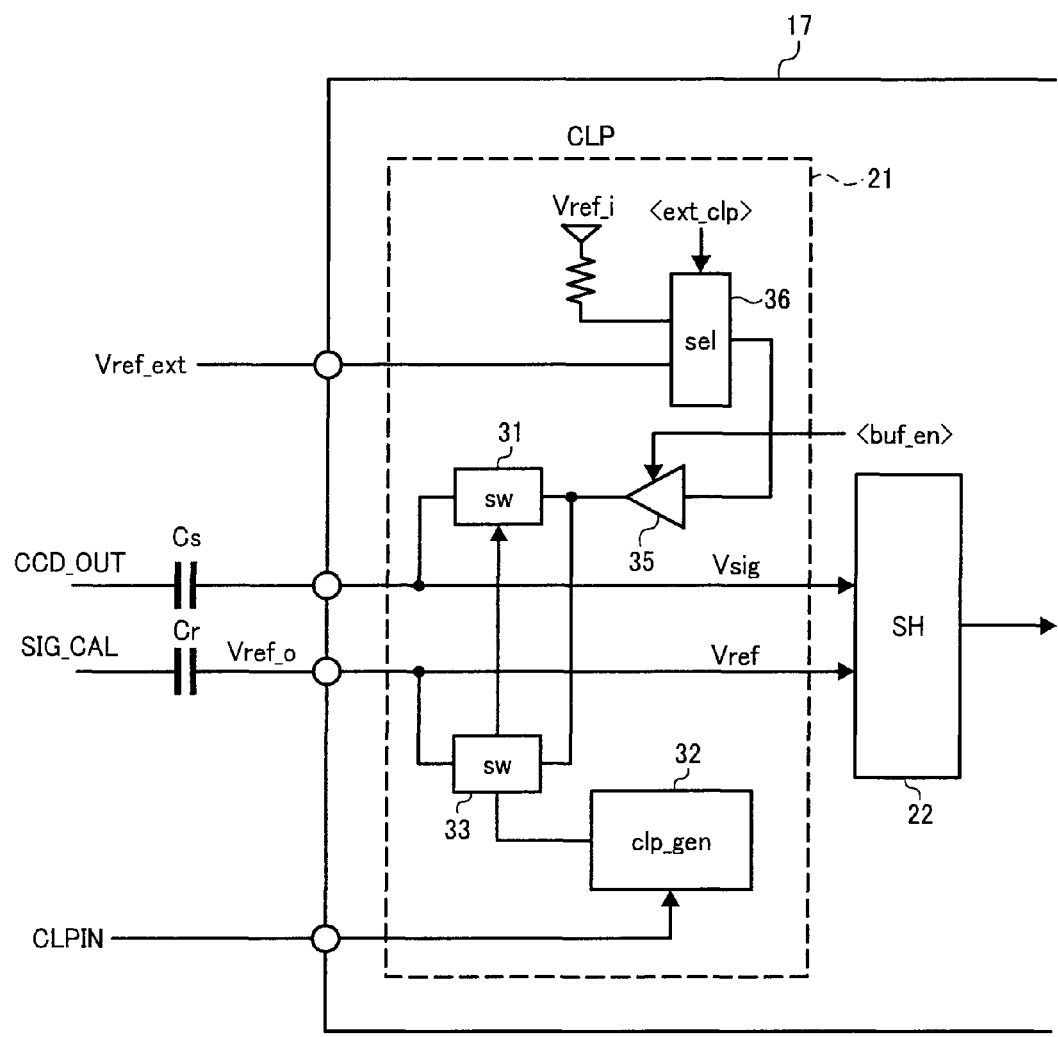
FIG. 12 is a schematic diagram of a fifth example of the clamping circuit.

In the analog signal processing unit 17 as shown in FIG. 12, an input signal can be treated as an image signal unlike the external reference voltage Vref_ext. The sampling/holding circuit 22 treats the external reference voltage Vref_ext as a clamping voltage and an input reference signal Vref_o as an image signal.

Thus, e.g., image correction (i.e., negating the effect of noise or waves in the image) can be performed by inputting a correction signal SIG_CAL via the capacitor Cr and correcting the image signal Vsig.

However, if the output of the buffer circuit 35 is switched ON while inputting the correction signal SIG_CAL, there is a possibility that the buffer circuit 35 is subjected to overvoltage or overcurrent, or the output of the correction signal SIG_CAL and the reference signal Vref collide. As a result, the buffer circuit 35 may not work properly. Thus, when inputting the correction signal SIG_CAL, i.e., when using the input reference signal Vref_o, an output signal buf_en of a register (not shown) is used to switch OFF the output of the buffer circuit 35.

Figure 13:
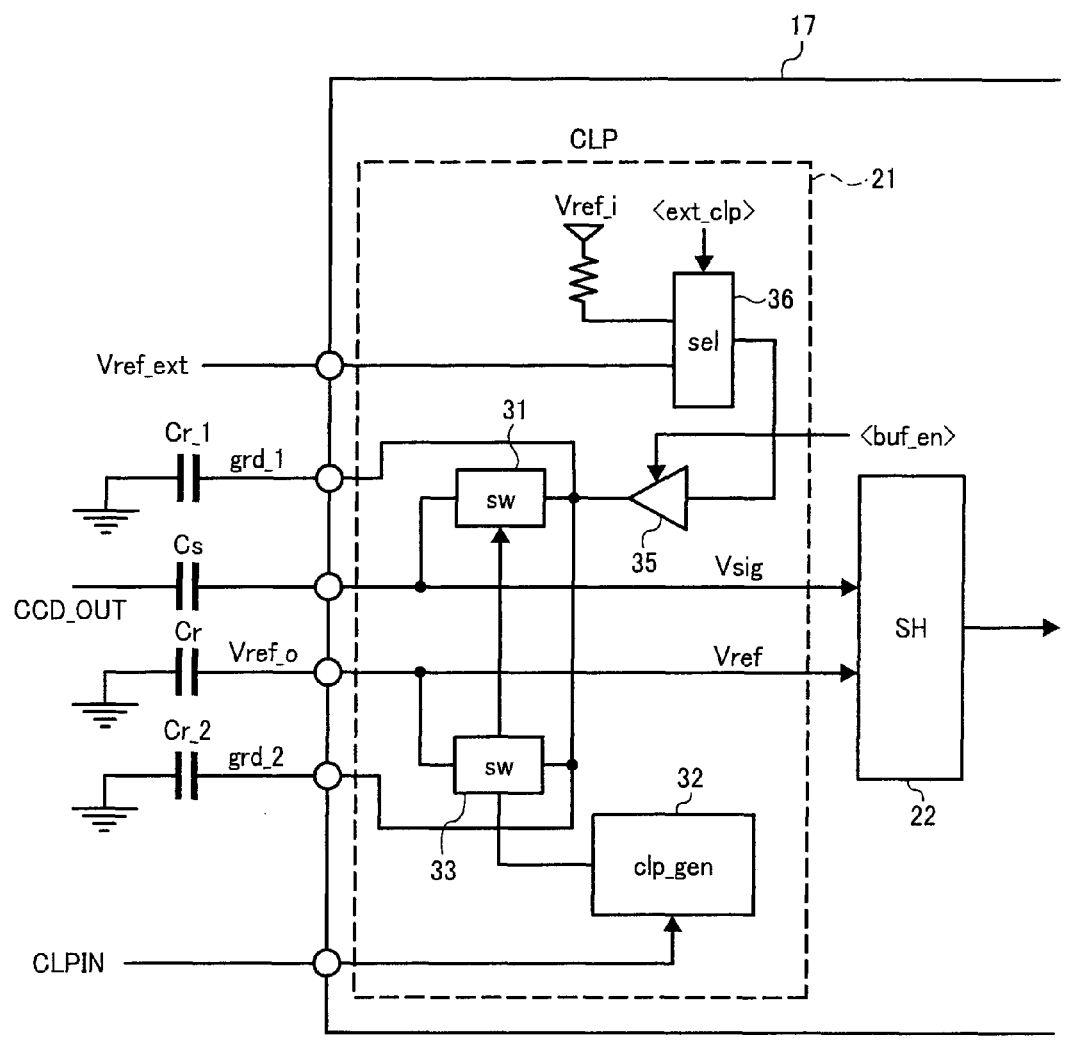
FIG. 13 is a schematic diagram of a sixth example of the clamping circuit.

Moreover, after inputting the correction signal SIG_CAL, sometimes it is necessary to perform independent correction for each color (red, green, or blue) or each channel (Even/ODD) depending on the configuration of a circuit. For that, an independent Vref_o-signal terminal is arranged corresponding to each color or channel as shown in FIG. 13.

Meanwhile, in principle, the base voltage of the image signal is maintained constant because of the electric potential charged in the capacitor Cs.

However, in practice, because of a leak current in the capacitor Cs or a leak current between terminals arranged in the analog signal processing unit 17, the voltage varies slightly with time. If the black offset correcting unit 25 has a smaller correction range, then the variation in the voltage results in immediate degradation in image quality.

To solve the problem of leak current between terminals, a guard terminal (such as grd_1 and grd_2 in FIG. 13) is arranged between each pair of an image signal input terminal and a Vref_o-signal terminal. Each guard terminal has an identical electrical potential to that of the corresponding Vref_o-signal terminal.

Moreover, it is possible to counterbalance the leak current in the capacitor Cs by having an identical configuration for the capacitor Cs and the capacitor Cr.

If the correction range of the black offset correcting unit 25 is sufficiently large, a guard terminal can be arranged only for either one of the image signal Vsig and the reference signal Vref, instead of arranging a separate guard terminal for each of the image signal Vsig and the reference signal Vref as shown in FIG. 13.

Meanwhile, constituent elements in FIG. 13 having identical configuration to those in FIG. 12 are referred to by the same reference numerals and there description is not repeated.

As described above, the buffer circuit 35 is arranged to reduce the voltage clamping time as well as the start-up time. That time can be further reduced by performing constant voltage clamping, instead of the usual practice of performing voltage clamping only for an arbitrary period (e.g., OPB period, blank pixel period) within one scanning line.

In that case, the voltage clamping is started just after switching ON the power supply and the capacitors are charged until a correction error falls within the correction range of the black offset correcting unit 25. Once the correction error falls within the correction range of the black offset correcting unit 25, the voltage clamping can be performed only for an arbitrary period within one scanning line, which is the usual practice. Meanwhile, there is a possibility that the analog signal processing unit 17 is subjected to overvoltage while switching ON the power supply. However, overvoltage protection can be achieved by performing constant voltage clamping as described above.

When the image reading device reads a color image, it is necessary to input the image signal in six channels, each corresponding to a color (red, green, and blue) combined with Even/ODD. In that case, sometimes it is necessary to arrange a plurality of analog signal processing units 17 on an image-reading control plate. However, such a configuration increases the size of the image-reading control plate as well as the manufacturing cost.

Figure 14:
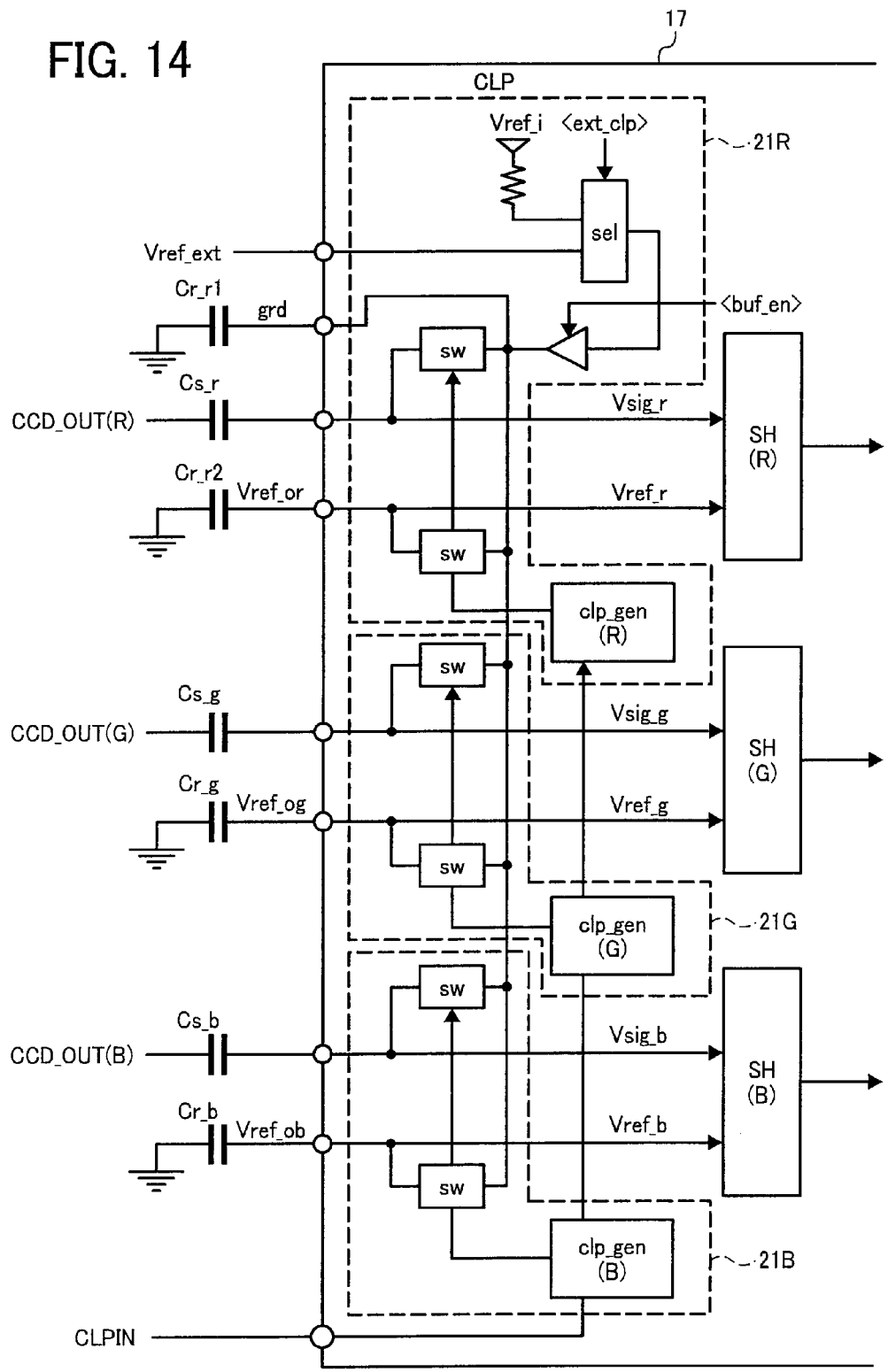
FIG. 14 is a schematic diagram of a seventh example of the clamping circuit.

Thus, to downsize the image-reading control plate, the analog signal processing unit 17 as shown in FIG. 14 has a three channel input configuration for inputting three analog image signals, viz., a red image signal CCD_OUT(R), a green image signal CCD_OUT (G), and a blue image signal CCD_OUT(B). Similarly, the analog signal processing unit 17 can also have a six channel input configuration (not shown).

Meanwhile, constituent elements in FIG. 14 having identical configuration to those in FIG. 13 are referred to by the same reference numerals and there description is not repeated.

The abovementioned configuration enables not only to downsize the analog signal processing unit 17 but also to improve image quality by reducing the difference in peculiarities of each color or channel. Meanwhile, the problem of leak current can be solved by arranging an additional guard terminal in the analog signal processing unit 17 as shown in FIG. 15.

Generally, an image reading device includes an image-reading control plate on which a timing signal generating circuit, a CCD line image sensor, a CCD driving circuit, an analog signal processing unit, and a corresponding wiring pattern are arranged. Such a configuration makes it difficult to downsize the image-reading control plate and decrease the manufacturing cost.

Figure 15:
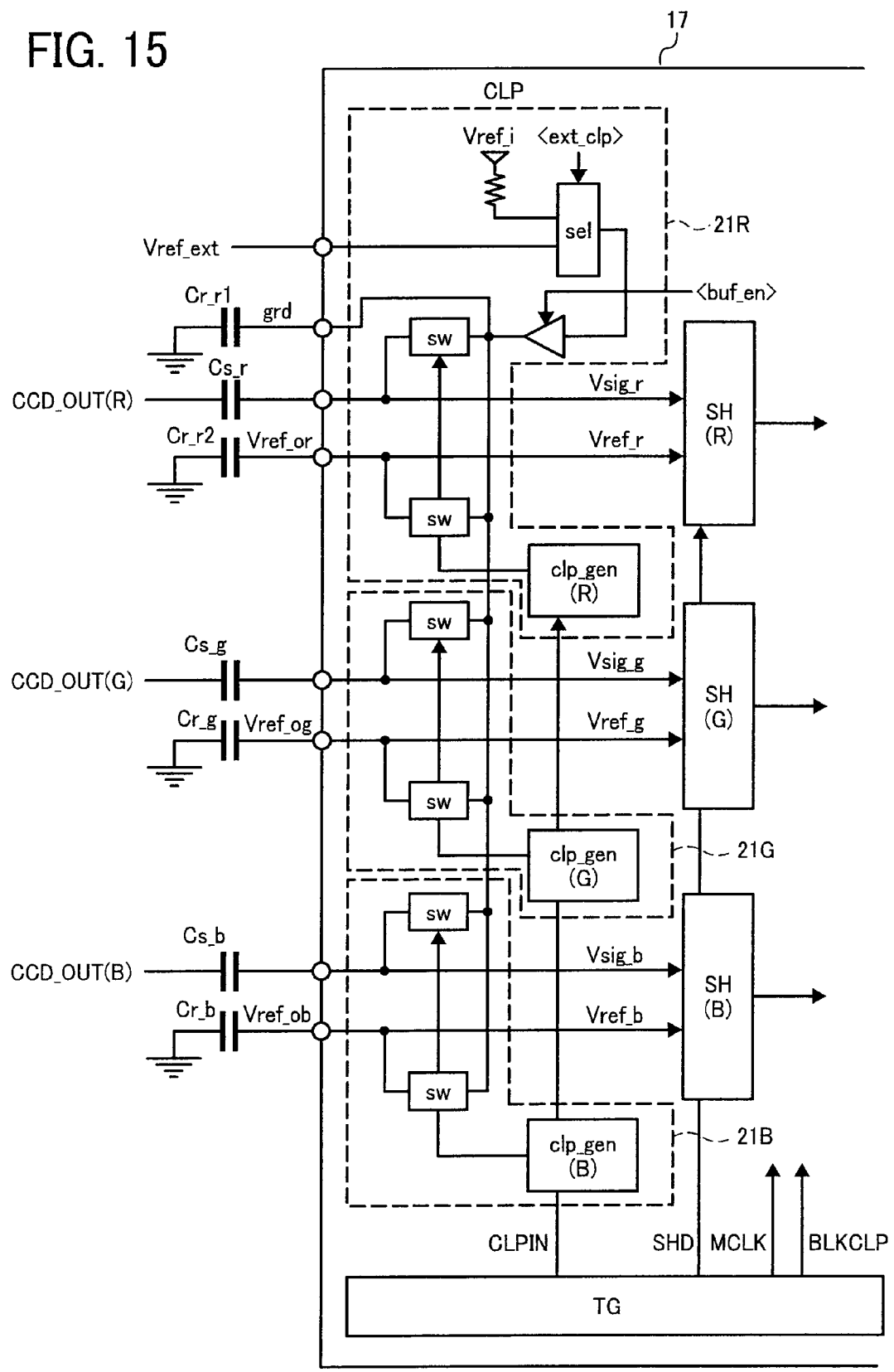
FIG. 15 is a schematic diagram of an eighth example of the clamping circuit.

Thus, to downsize the image-reading control plate, a timing signal generating mechanism 15' is arranged inside the analog signal processing unit 17 as shown in FIG. 15. Such a configuration helps in downsizing the image-reading control plate as well as reducing the manufacturing cost.

More particularly, such a configuration enables to generate a master clock signal (MCLK) or a plurality of gating signals (e.g., CLPIN) inside the analog signal processing unit 17 thereby largely reducing the wiring pattern and downsizing the image-reading control plate.

Although the above embodiments are described with respect to an image reading device, the embodiments are applicable for an image forming apparatus (e.g., a copying machine or a multifunction product (MFP)) that includes the image reading device.

As described above, according to an aspect of the present invention, it is possible to eliminate the effect of fluctuation in a reference voltage on an analog image signal by submitting the reference voltage and a base voltage of the analog image signal to an identical condition, i.e., by performing voltage clamping for the base voltage of the analog image signal as well as the reference voltage.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An analog processing circuit included in an image reading device, which is included in an image forming apparatus, the analog processing circuit comprising:
   an internal reference voltage;
   a first clamping unit configured to clamp a base voltage of an input image signal to a predetermined reference voltage obtained based on the internal reference voltage;
   a second clamping unit configured to obtain a reference signal from the internal reference voltage so as to have a same voltage as the predetermined voltage;
   a sampling-and-holding unit configured to receive input of the image signal after clamping and the reference signal, obtain a difference in the image signal after clamping and the reference signal as an image signal component of the image signal, and sample and hold an image signal consisting of the image signal component;
   an amplifying unit configured to amplify the image signal consisting of the image signal component obtained by the sampling-and-holding unit; and
   an analog-to-digital converting unit configured to convert the image signal after amplification into a digital image signal.

2. The analog processing circuit according to claim 1, wherein each of the first clamping unit and the second clamping unit includes a buffer unit for buffering the reference voltage.

3. An analog integrated circuit device included in an image reading device, which is included in an image forming apparatus, the analog integrated circuit device comprising:
   an analog processing circuit that includes
      an internal reference voltage;
      a first clamping unit configured to clamp a base voltage of an input image signal to a predetermined reference voltage obtained based on the internal reference voltage,
      a second clamping unit configured to obtain a reference signal from the internal reference voltage so as to have a same voltage as the predetermined voltage,
      a sampling-and-holding unit configured to receive input of the image signal after clamping and the reference signal, obtain a difference in the image signal after clamping and the reference signal as an image signal component of the image signal, and sample and hold an image signal consisting of the image signal component,
      an amplifying unit configured to amplify the image signal consisting of the image signal component obtained by the sampling-and-holding unit, and
      an analog-to-digital converting unit configured to convert the image signal after amplification into a digital image signal.

4. The analog integrated circuit device according to claim 3, wherein each of the first clamping unit and the second clamping unit includes a buffer unit for buffering the reference voltage.

5. The analog integrated circuit device according to claim 3, further comprising:
   an input terminal configured to input an external reference voltage;
   a selecting unit configured to select either one of the external reference voltage and the internal reference voltage, and supply the internal reference voltage to the first clamping unit and the second clamping unit, in response to selecting the internal reference voltage; and
   a register unit configured to output a selection signal for specifying a selection operation of the selecting unit to the selecting unit.

6. The analog processing circuit according to claim 1, wherein each of the first clamping unit and the second clamping unit includes a capacitor for obtaining an unaffected voltage as the predetermined reference voltage.

* * * * *